US009992900B2

(12) United States Patent
Good et al.

(10) Patent No.: US 9,992,900 B2
(45) Date of Patent: Jun. 5, 2018

(54) ELECTRONIC EQUIPMENT DIVIDER ASSEMBLY

(71) Applicant: International Business Machines Corporation, Armonk, NY (US)

(72) Inventors: Michael S. Good, Fountain, MN (US); Curtis E. Larsen, Eden Valley, MN (US); Kevin M. O'Connell, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/677,579

(22) Filed: Aug. 15, 2017

(65) Prior Publication Data
US 2018/0116067 A1   Apr. 26, 2018

Related U.S. Application Data

(63) Continuation of application No. 15/334,322, filed on Oct. 26, 2016.

(51) Int. Cl.
*H05K 7/14* (2006.01)
*A47B 88/975* (2017.01)
*A47B 88/969* (2017.01)

(52) U.S. Cl.
CPC ......... *H05K 7/1487* (2013.01); *A47B 88/975* (2017.01); *H05K 7/1421* (2013.01); *A47B 2088/976* (2017.01)

(58) Field of Classification Search
CPC .... H05K 7/1489; H05K 7/1487; H05K 7/183; H05K 7/14; H05K 5/0217; H05K 7/1421;
(Continued)

(56) References Cited

U.S. PATENT DOCUMENTS 6,154,361 A   11/2000  Anderson et al.
6,724,641 B1 *  4/2004  Hwang ................ G02B 6/4277
                                                         361/818

(Continued)

FOREIGN PATENT DOCUMENTS

WO          9959054 A1    11/1999

OTHER PUBLICATIONS

Good et al., "Electronic Equipment Divider Assembly", U.S. Appl. No. 15/334,322, filed Oct. 26, 2016.
(Continued)

*Primary Examiner* — Hiwot E Tefera
(74) *Attorney, Agent, or Firm* — Nicholas D. Bowman (57) ABSTRACT

A divider can be installed within an electronic equipment rack drawer to enhance the structural strength of the drawer. The divider can include two members, formed from plates of material, each member having a rectangular center section with a height spanning a distance between a top plate and an upper base plate of an electronic equipment rack drawer. The two members can each have a header and a footer extending outwardly from the center section. The headers can be attached to the top plate, and the footers can be attached to the upper base plate of the electronic equipment rack drawer. The center sections of the two members can be fastened, in an adjacent, coplanar orientation to each other.

1 Claim, 6 Drawing Sheets

(58) Field of Classification Search
CPC .......... H05K 7/18; G06F 1/187; G06F 1/189; G11B 33/124; G11B 33/128; A47B 88/975; A47B 2088/976
USPC ....... 211/184; 312/223.1, 223.2; 361/679.33, 361/679.02, 679.32, 679.34, 679.58, 724, 361/725, 727
See application file for complete search history.

(56) References Cited

U.S. PATENT DOCUMENTS

| | | | |
|---|---|---|---|
| 6,833,995 B1 | 12/2004 | Hsue et al. | |
| 8,210,622 B2 * | 7/2012 | Forrest | A47B 96/04 211/184 |
| 8,582,301 B2 * | 11/2013 | Fan | G06F 1/188 248/200 |
| 9,257,788 B1 | 2/2016 | Jia | |
| 2008/0310123 A1 * | 12/2008 | Sherrod | H05K 7/1488 361/725 |
| 2010/0238618 A1 * | 9/2010 | Chang | G11B 33/127 361/679.4 |
| 2010/0264787 A1 | 10/2010 | Fan et al. | |
| 2012/0169188 A1 * | 7/2012 | Fan | G11B 33/128 312/223.1 |
| 2012/0169189 A1 * | 7/2012 | Fan | G11B 33/128 312/223.1 |
| 2012/0236491 A1 | 9/2012 | Wallace et al. | |
| 2012/0314357 A1 * | 12/2012 | Li | H05K 7/1489 361/679.4 |
| 2015/0043146 A1 * | 2/2015 | Li | H05K 7/1487 361/679.31 |
| 2015/0163946 A1 * | 6/2015 | Kyle | H05K 7/1421 312/295 |
| 2015/0173235 A1 | 6/2015 | Ma et al. | |
| 2015/0293566 A1 | 10/2015 | Ehlen et al. | |
| 2016/0014925 A1 | 1/2016 | Ma et al. | |
| 2016/0270250 A1 | 9/2016 | Chen et al. | |

OTHER PUBLICATIONS

IBM, "List of IBM Patents or Patent Applications Treated as Related", Aug. 15, 2017, 2 pages.

* cited by examiner

ELECTRONIC EQUIPMENT DIVIDER ASSEMBLY

BACKGROUND

The present disclosure generally relates to electronic equipment enclosure structures. In particular, this disclosure relates to a divider installed within an electronic equipment rack drawer.

Equipment cabinets or racks may be used to contain servers, computer systems, telecommunications equipment and other information technology (IT) devices. Equipment cabinets may be provided in relatively tall and narrow configurations, and may house vertically stacked equipment in order to conserve floor space. For example, one standard cabinet configuration may be approximately 72 inches tall by approximately 22 inches wide.

Equipment cabinets can include removable drawers suitable for enclosing electronic devices such as servers, storage units, and networking hardware. In certain applications, such removable drawers can be located at the front of an equipment cabinet to provide easy access to electronic devices contained within them. In some applications, a number of similar or identical electronic devices, which may have a standard set of dimensions and connector placements, can be housed within a single removable drawer.

Equipment cabinets can also include front and rear doors which may provide the cabinets with a uniform appearance, protect devices housed within the cabinets from environmental hazards, restrict unauthorized access to the devices, and limit electromagnetic emissions from equipment within the cabinets.

SUMMARY

Embodiments may be directed towards a divider installed in an electronic equipment rack drawer. The divider can include a first member formed from a first plate of material. The first member can include a first center section with a rectangular shape, the first center section having a first height between a top edge and a bottom edge. The first height can span a distance between a top plate of and an upper base plate of an electronic equipment rack drawer. The first member can also include a first footer projecting outwardly from the bottom edge of the first center section in a first direction normal to the first center section. The first footer attached to the upper base plate. The first member can also include a first header projecting, in the first direction, outwardly from the top edge of the first center section. The first header attached to the top plate. The divider can also include a second member formed from a second plate of material and having a second center section that is rectangular. The second center section having a second height equal to the first height, between a second top edge and a second bottom edge. The second center section can be attached, in an adjacent, coplanar orientation to the first center section. The second member can further have a second footer, projecting outwardly from the bottom edge of the second center section, in a second direction opposite to the first direction and normal to the second center section. The second footer can be attached to the upper base plate. The second member can also have a second header, projecting outwardly, in the second direction, from the second top edge of the second center section. The second header attached to the top plate.

Embodiments may also be directed towards a method of attaching a divider to an electronic equipment rack drawer. The method can include aligning a first footer of a first divider member and a second footer of a second divider member with a corresponding at least one opening in an upper base plate of an electronic equipment rack drawer. The method can also include inserting, into the at least one opening, the first footer and the second footer. The method can also include rotating the first divider member and the second divider member to bring a center section of the first divider member into an adjacent, coplanar orientation with a center section of the second divider member. The method can also include attaching the center section of the first divider member to the center section of the second divider member, attaching the first footer and the second footer to a bottom surface of an upper base plate of the electronic equipment rack drawer and attaching the first header and the second header to a bottom surface of a top plate of the electronic equipment rack drawer.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing enhanced rigidity of, and increased usable space for electronic devices within, electronic equipment rack drawers used in electronic systems. Such systems can include servers, which may be used to provide data to clients attached to a server through a network. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing enhanced rigidity of electronic equipment rack drawers for systems such as computing systems, which may be used in a wide variety of computational and data processing applications. Such computing systems may include, but are not limited to, supercomputers, high-performance computing (HPC) systems, and other types of special-purpose computers. Embodiments may also be directed towards providing enhanced rigidity of electronic equipment rack drawers for electronic system enclosures to facilitate enclosure structural integrity during shipment of populated equipment enclosures.

For ease of discussion, the term "electronic equipment rack" is used herein, with reference to a stable mechanical structure and/or framework within which various electronic devices or modules can be mounted and interconnected. Electronic equipment racks can be used for containing commercially available electronics such as computing systems, servers and network hardware. In the context of such a mechanical structure, the terms "electronic equipment rack," "rack," "rack-mount system," and "rack unit enclosure" can be used interchangeably. An electronic equipment rack drawer, also referred to as an "electronic equipment enclosure," "electronic enclosure" or "storage enclosure" can be a mechanical container designed to house multiple electronic devices and to fit within an electronic equipment rack.

For ease of discussion, the term "divider" is used herein, with reference to a mechanical barrier, border or wall between adjacent electronic devices within an electronic equipment rack drawer. In the context of such a separating structure, the terms "divider," "bay separator" and "module alignment structure" may be used interchangeably.

In order for rack-based electronic systems to meet increasing performance demands, such systems are being designed to have increased volumes of electronic devices located within fixed volume constraints of equipment racks and drawers. Space within electronic equipment rack drawers which had previously been allocated to structural members such as dividers may therefore be reallocated to additional electronic/computing and cooling devices and to cooling air passageways. Reducing the space that is allocated within in a drawer to structural members such as dividers can result in compromised mechanical strength and structural integrity of an electronic equipment rack drawer. Locating fans, power supplies, hard disk drives and other storage devices at or near the front of an equipment rack can particularly exacerbate the problem of limited space for dividers and other structural members at the front of the system. A high placement density of electronic devices, e.g., hard disk drives, solid-state drives (SSDs) and flash memory units can leave very little space between adjacent devices in which to structurally connect a top plate and a bottom or base plate of a rack drawer. For example, in some applications, an available distance in which to locate a divider between adjacent electronic devices may be equivalent to only one or two thicknesses of sheet metal.

Various structures and methods can be used in order to structurally reinforce and secure the top and base plates of an electronic equipment rack drawer. However, such structures and methods can lack the robustness and structural integrity of the divider described in the present disclosure. For example, certain dividers can include a simple, single footer for the purpose of providing reinforcement between a top plate and a base plate of a drawer. However, such footers can be susceptible to deformation resulting from a mechanical shock event. Embosses and other structural reinforcement features can be added to divider to strengthen bends used to form headers and footers in divider material plates. However, such structural reinforcement features can consume space and lack the robustness and structural integrity of the divider presented in the present disclosure.

According to embodiments, the present disclosure includes an overlapping divider structure consisting of two symmetrical members each having a header and a footer. The headers and footers of a divider structure are attached to a top plate and to a base plate of an electronic equipment rack drawer. Such a divider structure can take advantage of the cumulative structural properties of multiple adjacent and attached material layers and complementary headers and footers. The vertical sections of the divider include footers, formed by bending, that are secured between a lower base plate and an upper base plate. In this way, the footers can take advantage of the added strength of the upper and lower base plates, which can prevent the footer deformation during shipping shock and vibration events. The footers and the base plates are generally fabricated from sheet metal, although in some embodiments, other materials can be used. Center vertical sections of the divider members are also securely fastened together in multiple locations to increase rigidity. The use of two divider members in conjunction with the described method of installation has demonstrated substantial improvements in chassis structural integrity through both finite element analysis (FEA) and physical testing.

Various aspects of the present disclosure may consume less area than other divider structures and can be useful for providing increased area for electrical devices within an electronic equipment rack drawer. A divider structure configured according to embodiments of the present disclosure may have increased rigidity due to headers and footers extending outwardly from both sides of the vertical center sections of the divider members. According to embodiments, such dividers can be easily attached to an electronic equipment rack drawer through a manual or automated assembly process. Various embodiments of the present disclosure relate to a divider assembly installed within electronic equipment rack drawer configured to add rigidity to the electronic equipment drawer assembly.

A divider assembly designed according to certain embodiments may be compatible with existing and proven electronic equipment enclosures and drawers, and may be a useful and cost-effective way to add mechanical stability to such enclosures. A divider assembly constructed according to embodiments can be installed within an existing rack drawer, and may be useful for aligning electronic devices to connectors within a drawer, directing cooling airflow and providing electromagnetic interference (EMI) shielding. Aspects of the various embodiments may also be useful for providing cost-effective structural enhancement for use with electronic equipment rack drawers, by using existing and proven material fabrication and assembly techniques and technologies.

Depictions and descriptions of embodiments of the present disclosure can generally refer to divider members and portions of an electronic equipment rack drawer as being fabricated from sheet metal, however fabrication from other types of materials is possible. Embodiments depicted generally include the use of rivets as fasteners, however various other types of fasteners such as screws, broaching nuts, sheet-metal nuts and high-strength adhesives such as metal-impregnated epoxy may also be used.

Figure 1:
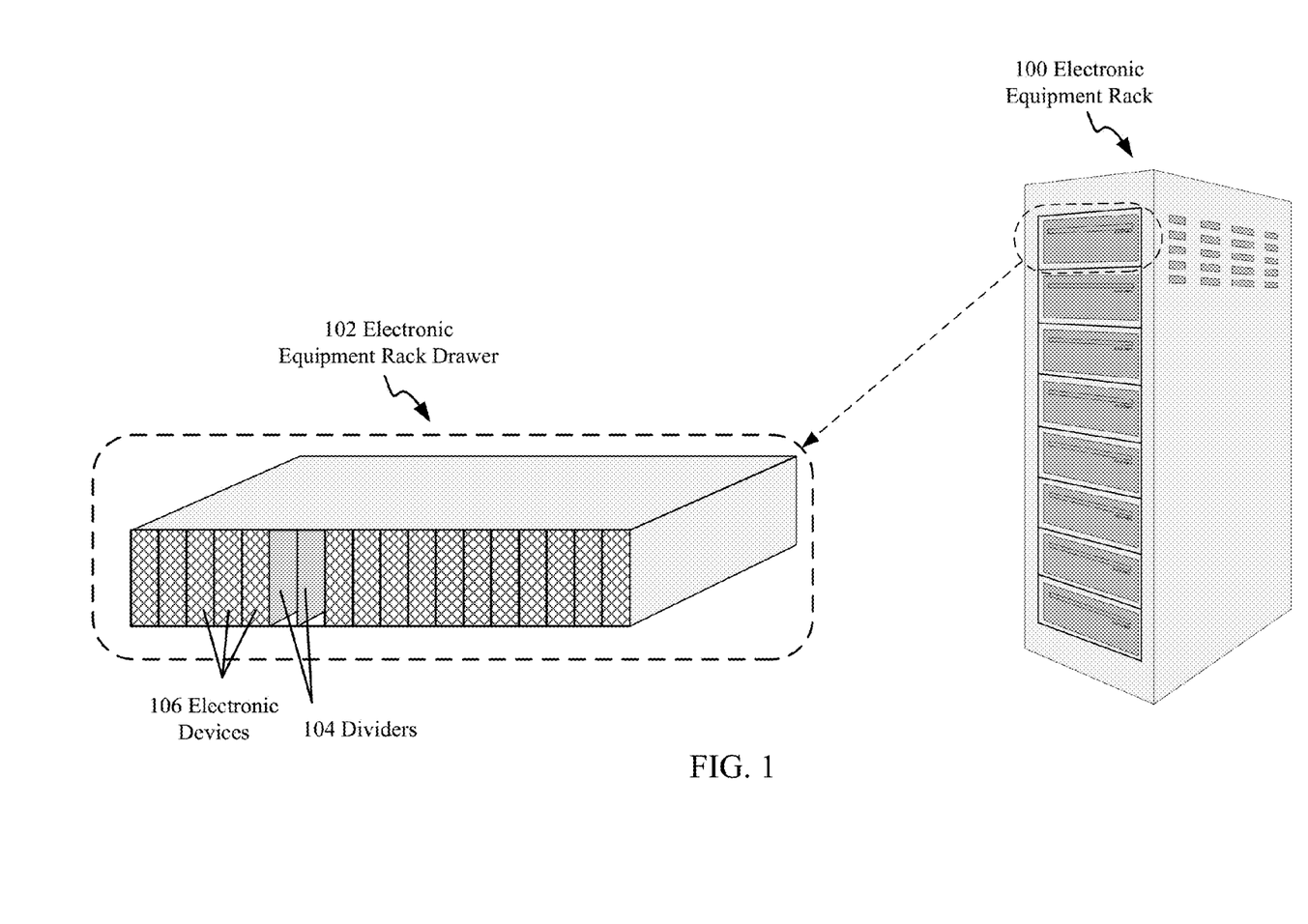
FIG. 1 depicts an electronic equipment rack drawer having electronic devices and dividers, according to embodiments of the present disclosure.

Certain embodiments relate to the attachment of a divider within an electronic equipment rack drawer. FIG. 1 depicts an electronic equipment rack drawer 102 having electronic devices 106 and dividers 104, according to embodiments of the present disclosure.

Electronic equipment racks such as electronic equipment rack 100 can be useful for housing electronic systems such as computers, servers and networking/telecommunications equipment. Electronic equipment racks may be constructed according to industry standard dimensions and specifications, for example, the Electronic Industries Alliance (EIA) specification EIA-310-D for 19" equipment racks. Such specifications can include dimensions such as a standard "rack unit" or "U" height of 1.75", an electronic device width of 17.75" and depth of 36". According to this standard, for example, a typical "full" 19" rack may be 42 U or 73.5" in height. In embodiments, electronic equipment rack drawer 102 can have a height that is equal to a multiple of rack units.

Electronic equipment rack drawers, e.g., 102, can be used within an electronic equipment rack 100 to contain a number of similar electronic devices 106. Dividers 104 can be useful in segregating an area enclosed by an electronic equipment rack drawer 102 into individual "compartments" or "bays", where each compartment is suitable to enclose one or more electronic devices 106. In applications, electronic devices 106 can include but are not limited to, hard disk drives, SSDs, flash memory units, processor cards or "blades", power supply units, network routers/switches and other electronic functional units. Electronic devices 106 can be removable and/or replaceable units having one or more standard size(s), and can include electrical connectors located at standardized positions.

Dividers 104 can be used to enhance the mechanical stability of the electronic equipment rack drawer and to provide EMI shielding to electronic devices 106 within the electronic equipment rack drawer 102. Dividers 104 can also be used to direct cooling airflow around, to or through electronic devices 106. Dividers 104 can also provide boundaries for electronic devices 106 and can facilitate alignment of an electronic device 106 connector with a mating connector located within a compartment.

Figure 2:
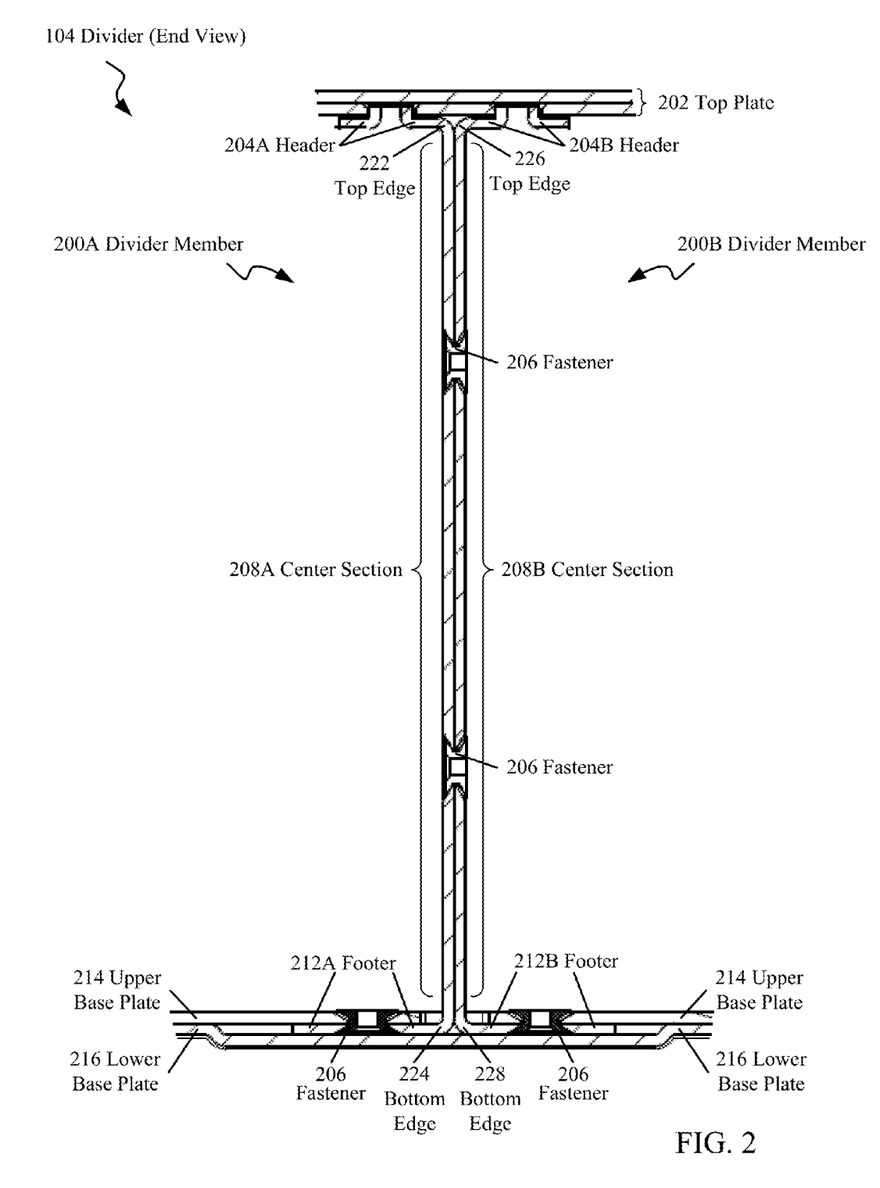
FIG. 2 depicts an end view of a divider installed within an electronic equipment rack drawer, according to embodiments consistent with the figures.

FIG. 2 depicts an end view of a divider 104 installed within an electronic equipment rack drawer, e.g., 102, FIG. 1, according to embodiments consistent with the figures. The divider 104 includes divider member 200A, divider member 200B and fasteners 206. Divider 104 can be useful for enhancing the structural integrity and rigidity of an electronic equipment rack drawer 102, FIG. 1, while occupying a limited amount of space within the rack drawer, e.g., 102, FIG. 1. Divider 104 can also be useful for dividing a drawer into compartments suitable for electronic devices, e.g., 106, FIG. 1, directing cooling airflow and providing EMI shielding for electronic devices 106.

Divider member 200A is formed from a plate of material and includes a center section 208A formed in a rectangular shape, a header 204A and a footer 212A. According to embodiments, the center section 208A can be formed to have a height, between a top edge 222 and a bottom edge 224, spanning and corresponding to a distance between a top plate 202 and an upper base plate 214 of the electronic equipment rack drawer 102, FIG. 1. According to embodiments, the height of the center section 208A can be specified so that divider member 200A fits snugly between the top plate 202 of and the upper base plate 214 of the electronic equipment rack drawer 102, FIG. 1.

Header 204A and footer 212A both project outwardly from the top edge 222 and bottom edge 224, respectively, of the center section 208A, in a direction normal or perpendicular to center section 208A. In some embodiments, the header 204A and footer 212A can each be an individual section or "tab" of material, and in some embodiments, the header 204A and footer 212A can include multiple sections or tabs of material. According to embodiments, the header 204A and footer 212A can be formed through a process of bending, at the top edge 222 and the bottom edge 224, respectively, the plate of material from which divider member 200A is formed. In accordance with the material properties and associated fabrication techniques, the top edge 222 and bottom edge 224 may have a variety of bend radii.

Similarly to divider member 200A, divider member 200B is formed from a plate of material and includes a center section 208B formed in a rectangular shape, a header 204B and a footer 212B. According to embodiments, the center section 208B can be formed to have a height, between top edge 226 and bottom edge 228, spanning and corresponding to the distance between a top plate 202 and an upper base plate 214 of the electronic equipment rack drawer 102, FIG. 1. According to embodiments, the height of the center section 208B can be specified so that divider member 200B fits snugly, adjacent to divider member 200A, between the top plate 202 of and the upper base plate 214 of the electronic equipment rack drawer 102, FIG. 1.

Header 204B and footer 212B both project outwardly from the top edge 226 and bottom edge 228, respectively, of the center section 208B, in a direction normal or perpendicular to center section 208. Header 204B and footer 212B are configured to project outwardly from center section 208B in an opposite direction from header 204A and footer 212A. In some embodiments, the header 204B and footer 212B can each be an individual section or "tab" of material, and in some embodiments, the header 204B and footer 212B can include multiple sections or tabs of material. According to embodiments, the header 204B and footer 212B can be formed through a process of bending, at the top edge 226 and the bottom edge 228, respectively, the plate of material from which divider member 200B is formed. In accordance with the material properties and associated fabrication techniques, the top edge 226 and bottom edge 228 may have a variety of bend radii.

In some embodiments, the top plate 202 of the electronic equipment rack drawer 102 can be formed or shaped to accommodate a profile of headers 204A and 204B. For example, a recess can be formed to fit the combination of headers 204A and 204B by bending the top plate 202. Similarly, the upper base plate 214 of the electronic equipment rack drawer 102 can be formed or shaped to accommodate a profile of footers 212A and 212B. According to embodiments, the headers 204A and 204B, the center sections 208A and 208B, the footers 214 and 214B and the electronic equipment rack drawer 102 can include holes or passages of any suitable shape or size to accept fasteners.

Types of fasteners, e.g., 206, used in the assembly and attachment of a divider within an electronic equipment rack drawer can include screws, broaching nuts, sheet-metal nuts and high-strength adhesives such as metal-impregnated epoxy; however other types of fasteners may be useful in such assembly and attachment operations. According to embodiments, divider assembly and attachment operations can also be performed through the use of attachment processes including, but not limited to, spot welding and swaging.

Fasteners 206 may be used to securely attach the center sections 208A and 208B to each other, and may so be used to attach headers 204A and 204B to top plate 202, and to attach footers 212A and 212B to upper base plate 214. In some embodiments fasteners may also be used to attach lower base plate 216 of the electronic equipment rack drawer 102 to upper base plate 214. According to embodiments, center sections 208A and 208B can be attached in an adjacent, coplanar orientation to each other, as depicted in FIG. 2.

FIG. 2 can be useful in depicting and providing an understanding of how footers 212A, 212B of the divider can be sandwiched/anchored between the upper and lower base plates 214, 116 respectively, of the rack drawer 102, FIG. 1. FIG. 2 can be useful in depicting the attachment of footers to an upper base plate 214 of the rack drawer 102. Such attachment of divider member footers can provide increased footer and divider strength and stability over other types of divider designs.

In some embodiments, the plates of material from which divider member 200A and divider member 200B are formed can be sheets of materials such as carbon steel, powder-coated steel, zinc plated steel, stainless steel and aluminum. According to embodiments, such material sheets can have a thickness that is substantially uniform, within specified manufacturing tolerances, for example, within in a range between 0.024 in to 0.120 in. While depictions and descriptions of embodiments herein refer to dividers and portions of an electronic equipment rack drawer as being fabricated from sheet metal, however these depictions and descriptions are not limiting; other types of materials can be used in the fabrication of divider members.

Figure 3:
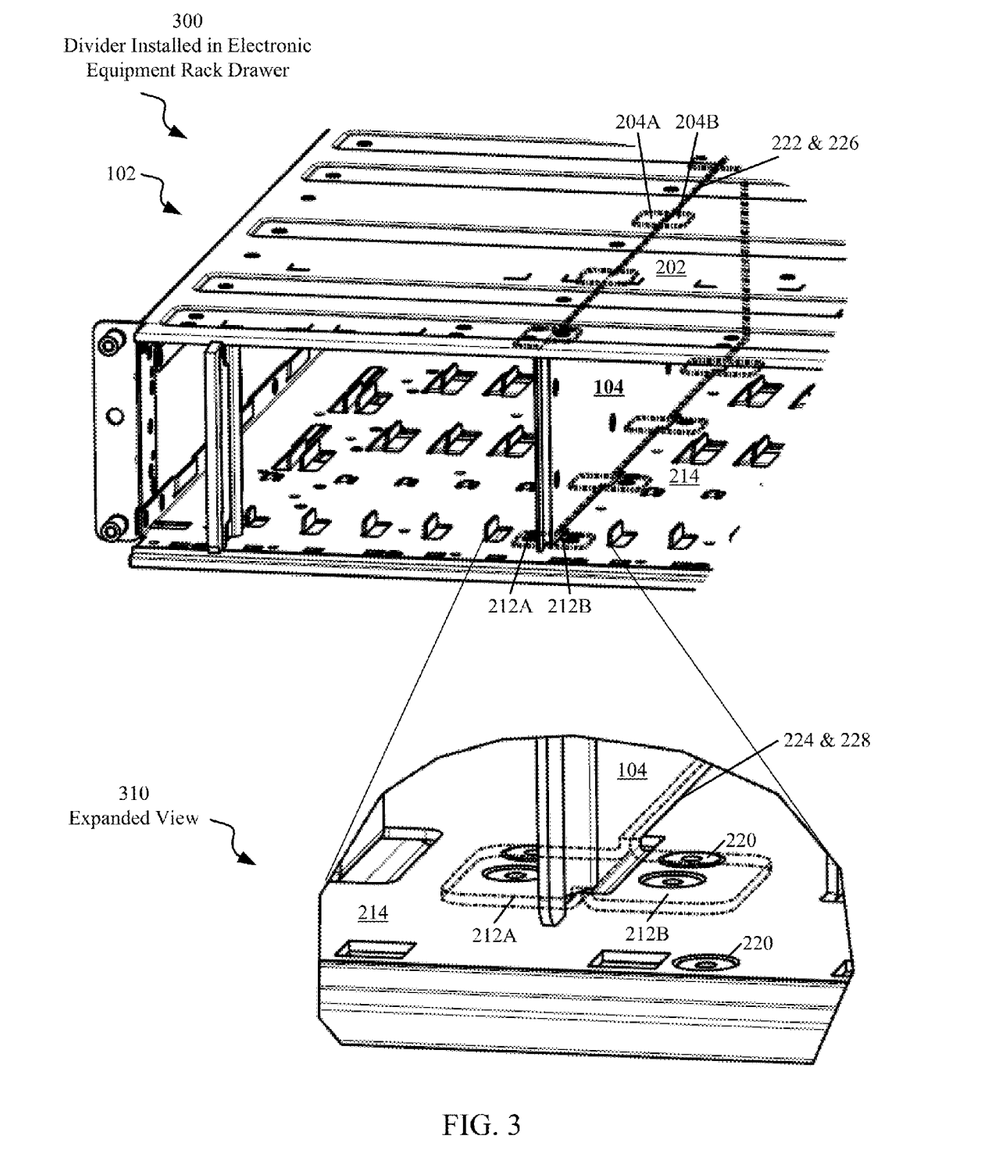
FIG. 3 includes isometric/expanded views of a divider installed within an electronic equipment rack drawer, according to embodiments consistent with the figures.

FIG. 3 includes isometric and expanded views 300 and 310 of a divider 104 installed within an electronic equipment rack drawer 102, according to embodiments consistent with the figures. FIG. 3 can be useful in aiding the visualization of the orientation and positioning of divider 104 within electronic equipment rack drawer 102, and the positioning of top edges 222 and 226 adjacent to top plate 202, as well as bottom edges 224 and 228 adjacent to upper base plate 214. FIG. 3 can also be useful in aiding the visualization of the symmetry of headers 204A and 204B, and the symmetry of footers 212A and 212B. Expanded view 310 depicts, through the use of dashed lines, the positioning of footers 212A and 212B underneath upper base plate 214. Also depicted in FIG. 3 are fastener holes 220 within the footers and additional small vertical alignment tabs, which, in certain applications, may be useful for aligning electronic devices, e.g., 106, FIG. 1, within the electronic equipment rack drawer 102.

Figure 4:
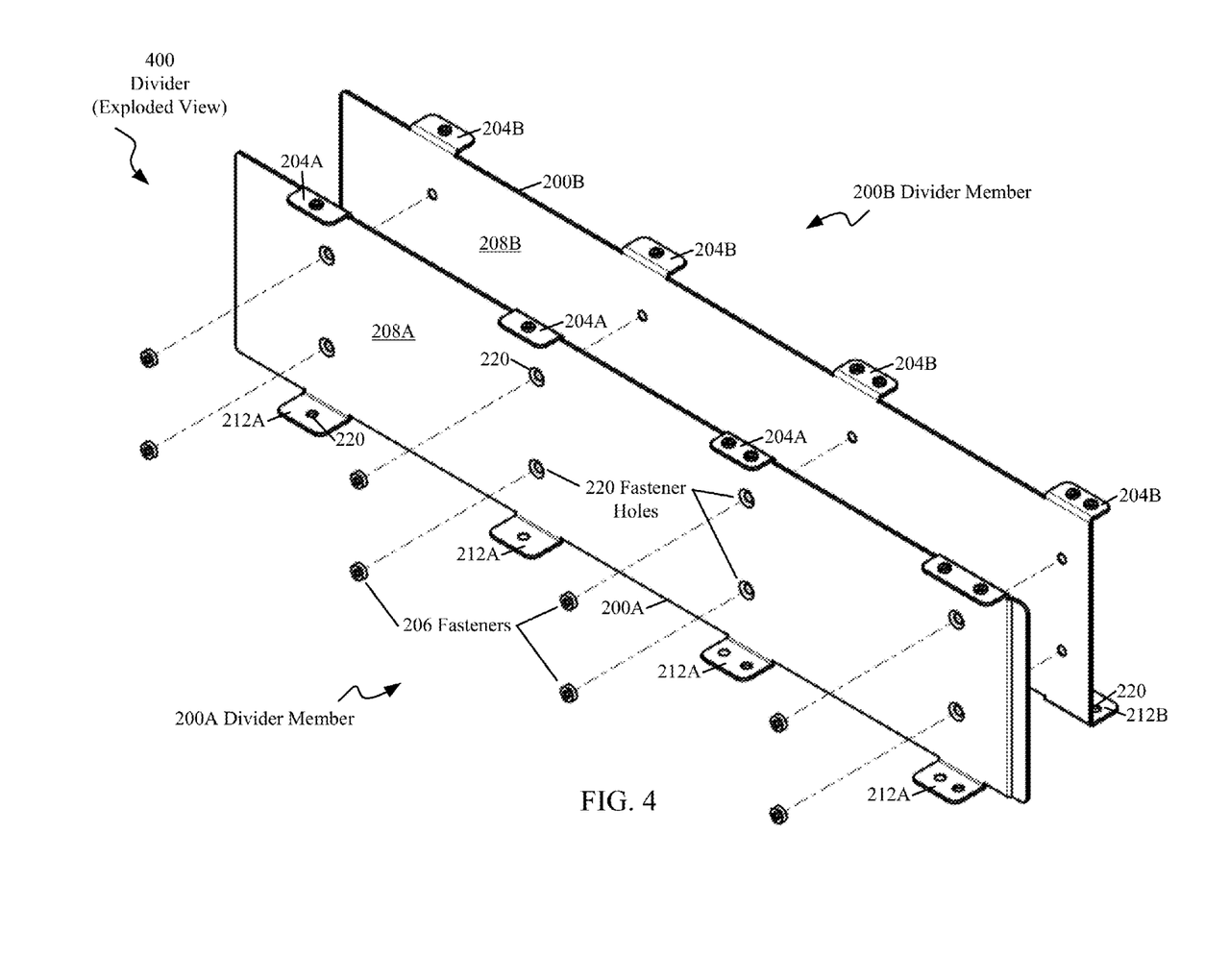
FIG. 4 is an exploded view of an electronic equipment rack drawer divider, according to embodiments consistent with the figures.

FIG. 4 is an exploded view 400 of an electronic equipment rack drawer divider, according to embodiments consistent with the figures. FIG. 4 can be useful in aiding the visualization of the features, symmetry and relative orientations of the two divider members 200A and 200B, apart from an electronic equipment rack drawer 102. Divider member 200A is depicted having a header 204A with four tabs, a header 212A with four tabs and fastener passages/holes 220. The fastener holes 220 are formed in the header 204A, the footer 212A, and in the center section 208A of divider member 200A. Similarly, symmetrical divider member 200B is depicted having a header 204B, footer 212B and fastener passages/holes 220. The fastener holes 220 are formed in the header 204B, the footer 212B, and the center section 208B of divider member 200B.

The center sections 208A and 208B of divider members 200A and 200B, respectively, are oriented in a relatively adjacent, planar orientation, so that the sets of fastener holes 220 formed in the pair of divider members are aligned to receive fasteners 206. According to embodiments, fasteners 206 are depicted as rivets, but in some embodiments could be other fastener types described above. The symmetry of divider members 200A and 200B is depicted, with the headers 204A and 204B, and footers 212A and 212B extending outwardly from divider members 200A and 200B, respectively.

Figure 5:
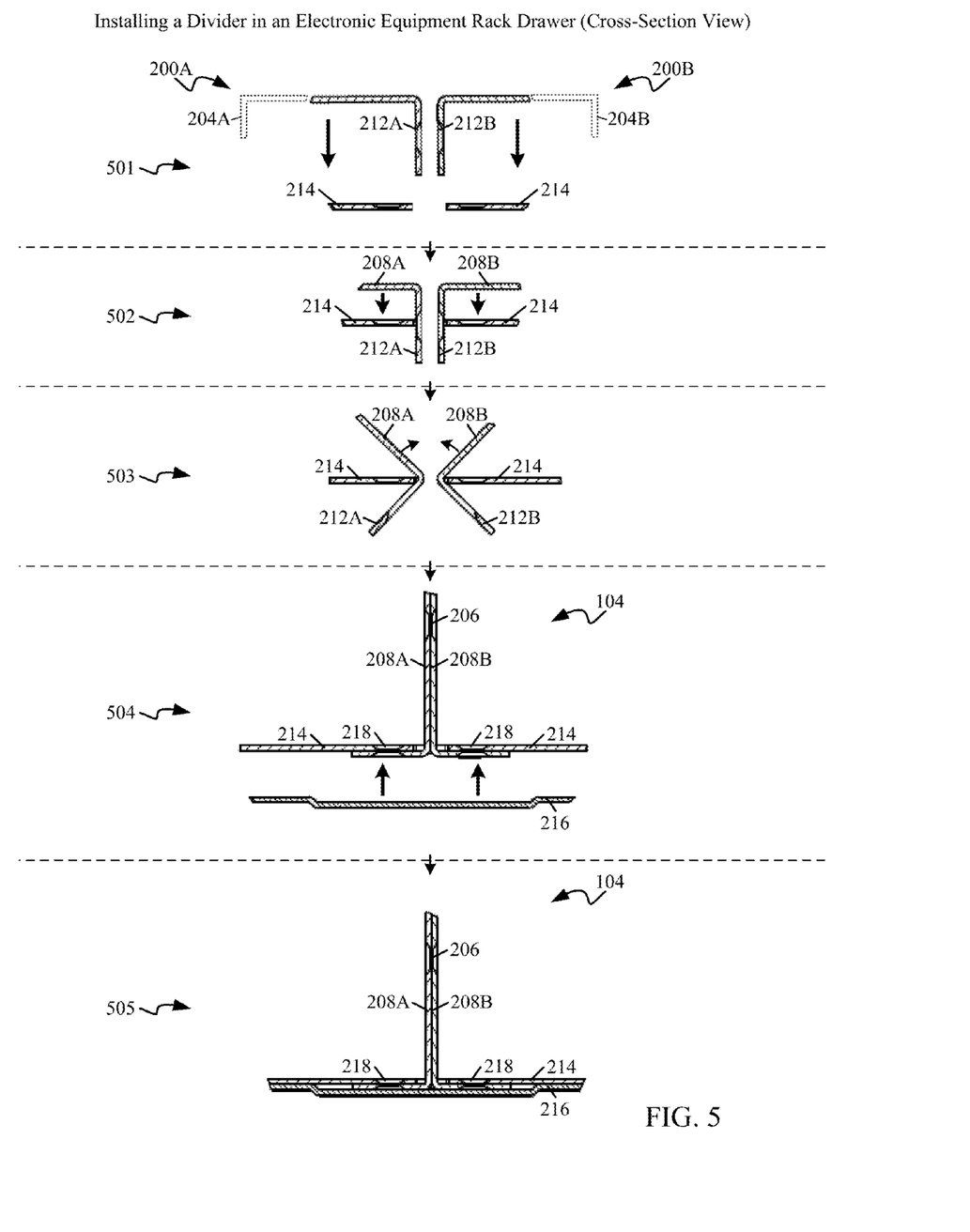
FIG. 5 is a diagram depicting a set of operations for installing a divider within an electronic equipment rack drawer, according to embodiments consistent with the figures.
Figure 6:
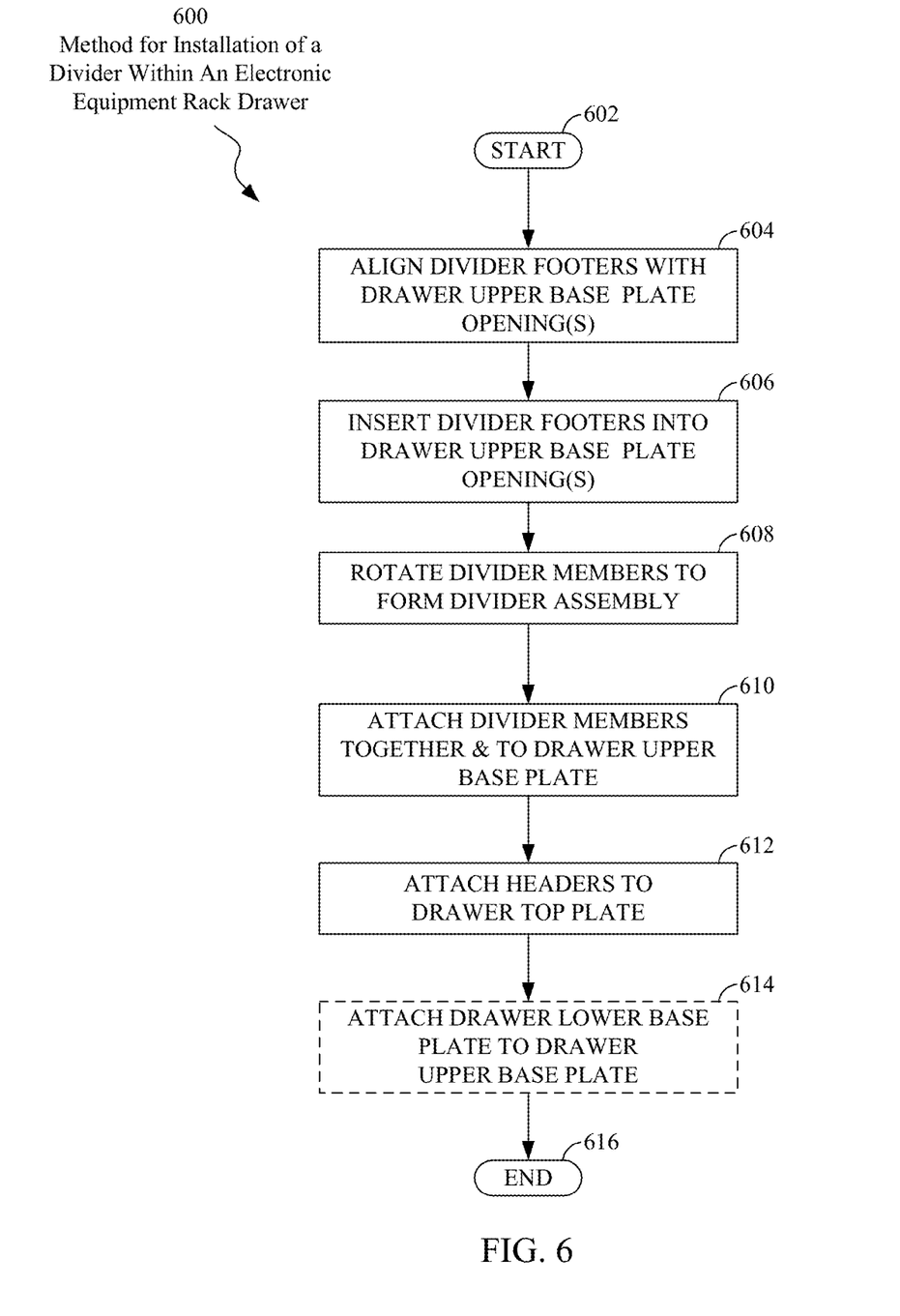
FIG. 6 is a flow diagram depicting a method for installation of divider within an electronic equipment rack drawer, according to embodiments consistent with the figures.

FIG. 5 depicts operations used for installing a divider within an electronic equipment rack drawer, according to embodiments consistent with the figures, particularly FIG. 6. FIG. 5 includes five cross-sectional views 501-505 illustrating the results of a sequential set of operations for installing a divider within an electronic equipment rack drawer. Assembly operations associated with views 501-505 may include, but are not limited to, aligning and insertion of dividing member footer within an opening, rotating of divider members, and attaching of divider members to each other and to the electronic equipment rack drawer.

The use of the set of operations depicted in FIG. 5 can result in increased usage efficiency of electronic equipment rack drawers by providing rack drawer reinforcement through thin, rigid divider assemblies located between adjacent electronic devices. According to embodiments, use of such dividers can allow increased room for electronic devices when compared to existing rack drawer structures. Operations depicted and described in FIG. 5 generally correspond to the set of operations included in the method 600, as depicted in FIG. 6 and described in the associated text. In embodiments, the operations depicted in FIG. 5 can be performed manually or through the use of automated assembly equipment, e.g., robotic assembly devices, consistent with assembly techniques used within the electronic packaging industry.

The progression depicted in views 501-505 begins with two unattached divider members 200A and 200B and an upper base plate 214, view 501, of electronic equipment rack drawer, i.e., 102, FIG. 1, and ends with divider 104, view 505, securely attached to the electronic equipment rack drawer, i.e., 102, FIG. 1.

For simplicity of illustration, completed structures are generally shown in the views as having sections with relatively thin cross-sectional profiles, with edges, corresponding to planar surfaces, at orthogonal and co-planar orientations to each other. This depiction, however, is not limiting; structures may be of any suitable shape, size and profile, in accordance with specific design criteria, material formation and assembly process limitations and tolerances for a given application. For example, corners may have a variety of bend radii, surfaces may have a non-orthogonal relative orientation, and relative dimensional ratios may vary from those depicted in the figures. Views 501-505 illustrate the process of assembling a single divider within an electronic equipment rack drawer, i.e., 102, FIG. 1, however, in embodiments, a plurality of dividers may be simultaneously assembled within an electronic equipment rack drawer.

View 501 depicts two unattached divider members 200A and 200B and an upper base plate 214 of electronic equipment rack drawer, i.e., 102, FIG. 1. View 501 depicts the results of aligning footers 212A and 212B of divider members 200A and 200B, respectively, with a corresponding opening in upper base plate 214 of the electronic equipment rack drawer 102, FIG. 1. For clarity of illustration, headers 204A and 204B of divider members 200A and 200B, respectively, have been depicted in view 501 using dashed lines, and have been omitted from views 502-505. It may be understood that headers 204A and 204B remain as part of divider members 200A and 200B, even though not explicitly included within views 502-505. Alignment of footers 212A and 212B with the opening in upper base plate 214 is necessary in order to insert footers 212A and 212B into the opening.

In some embodiments, footers 212A and 212B can have widths that are greater than the width of headers 204A and 204B, respectively. In some embodiments, footers 212A and 212B can be a single, individual tab, projecting outwardly from the bottom edges of center sections 208A and 208B, respectively. In some embodiments, footers 212A and 212B can include multiple tabs, each tab projecting outwardly from the bottom edges of center sections 208A and 208B, respectively. According to embodiments, upper base plate 214 can be formed to accommodate a profile of footers 212A and 212B.

View 502 depicts the results of inserting, into the opening in upper base plate 214, the footers 212A and 212B of divider members 200A and 200B. Prior to performing the rotating operation depicted in view 503, the center sections 208A and 208B may need to be brought adjacent to the upper base plate 214 in order to allow the rotating operation to be performed.

View 503 depicts the results of rotating the divider members 200A and 200B in order to bring the center section 208A of the divider member 200A into an adjacent, coplanar orientation with the center section 208B of divider members 200B. According to embodiments, as a result of the rotating, footers 212A and 212B will be brought into an adjacent, coplanar orientation with the bottom of upper base plate 214. As a result of rotating the divider members 200A and 200B, corresponding passageways or holes formed in center sections 208A and 208B are aligned, and similarly, corresponding passageways or holes formed in footers 212A and 212B are aligned with holes formed within upper base plate 214.

View 504 depicts the results of attaching center section 208A of divider member 200A to center section 208B of divider member 200B, and attaching footers 212A and 212B of divider members 200A, 200B, respectively, to the bottom side of upper base plate 214. The attachment of divider members to each other and footers to the upper base plate can include the use of fasteners such as a rivet, a screw or an adhesive, or can employ assembly techniques such as spot-welding or swaging. The attachment of the center sections of the divider members to each other, in conjunction with the attachment of the footers of the divider members to the upper base plate of the rack drawer creates a rigid divider structure that can be useful in providing enhanced structural integrity of both the divider and the electronic equipment rack drawer. View 504 also depicts the alignment of lower base plate 216 with the upper base plate 214.

View 504 depicts the results of attaching lower base plate 216 to upper base plate 214. In some embodiments, the operation depicted in view 505 can be optional. Such an attachment of lower base plate 216 can be useful in providing enhanced rigidity of the divider assembly through increased structural support, by limiting the motion of the footers 212A and 212B. In some embodiments, as depicted in view 505, lower base plate 216 can be shaped or formed with a profile or recess to accommodate the footers 212A and 212B.

In some embodiments, in addition to the operations described above, headers of the divider members, e.g., 204A and 204B, can be attached to a bottom surface of a top plate such as 202, FIG. 2 to further increase the structural integrity and rigidity of the divider assembly. Such attachment can be accomplished through the use of fasteners and/or assembly operations or techniques as described above.

FIG. 6 is a flow diagram depicting a method 600 for installation of a divider within an electronic equipment rack drawer, according to embodiments consistent with the figures. The implementation of method 600 can result in increased efficiency usage of electronic equipment rack drawer space by providing rack drawer reinforcement through thin, rigid divider assemblies located between adjacent electronic devices. According to embodiments, use of such dividers can allow increased room for electronic devices as compared to existing rack drawer structures. Operations depicted and described in FIG. 6 generally correspond to the set of operations for installing a divider depicted in FIG. 5 and described in the associated text.

The arrangement of blocks within the flow diagram 600 of FIG. 6 is not to be construed as limiting the order in which the individual operations may be performed, as certain embodiments may perform the operations of FIG. 6 in various alternative orders. Operation(s) depicted with dashed lines in FIG. 6 are optional operations within the method 600.

The process 600 moves from start 602 to operation 604. Operation 604 generally refers to aligning footers of the two divider members with corresponding opening(s) in an upper base plate of the electronic equipment rack drawer. Alignment of footers with the opening in upper base plate is necessary in order to insert the footers into the opening. In some embodiments, the footer of each divider member is a single section or tab, and in some embodiments, the footer includes multiple sections or tabs. In some embodiments a footer can have a width, projecting outwardly from a center section of the divider member, that are greater than the width of header of the same divider member. Once the footers are aligned, the process moves to operation 606.

Operation 606 generally refers to inserting, into the opening in upper base plate, the footers of the divider members. Prior to performing the rotating operation of operation 608, the center sections of the divider members may need to be brought adjacent to an upper base plate of the rack drawer in order to allow the rotating operation to be performed. Once the footers have been inserted, the process moves to operation 608.

Operation 608 generally refers to rotating the divider members in order to bring the center sections of the divider members into an adjacent, coplanar orientation with each other. According to embodiments, as a result of the rotating operation, footers will be brought into an adjacent, coplanar orientation to the upper base plate. As a result of rotating the divider members, corresponding passageways or holes formed in the center sections are aligned, and similarly, corresponding passageways or holes formed in footers are aligned with holes formed within upper base plate. Once the divider members have been rotated, the process moves to operation 610.

Operation 610 generally refers to attaching the center sections of divider members together and attaching the footers of divider members to the bottom side of an upper base plate of the electronic equipment rack drawer. The attachment operation(s) can include the use of fasteners such as a rivet, a screw or an adhesive, or can employ assembly techniques such as spot-welding or swaging. The attachment of the center sections of the divider members to each other in conjunction with the attachment of the divider member footers to the upper base plate of the rack drawer can create a rigid divider structure useful in providing enhanced structural integrity of both the divider and the electronic equipment rack drawer. Once the divider members are attached together and attached to upper base plate of the electronic equipment rack drawer, the process moves to operation 612.

Operation 612 generally refers to attaching divider member headers to an electronic equipment rack drawer top plate. The attachment of the headers of the divider members to a top plate of the electronic equipment rack in conjunction with the attachment of the divider member footers to the upper base plate of the rack drawer can further increase the structural integrity and rigidity of the divider assembly and rack drawer. The attachment operation(s) can include the use of fasteners such as a rivet, a screw or an adhesive, or can employ assembly techniques such as spot-welding or swaging. Once the divider member headers are attached to the electronic equipment rack drawer top plate, the process moves to operation 614.

Operation 614 generally refers to attaching a lower base plate to an upper base plate of the electronic equipment rack drawer. In some embodiments this operation can be optional. Such an attachment of lower base plate can be useful in providing enhanced rigidity of the divider assembly by limiting the motion of the divider member footers. In some embodiments the lower base plate can be shaped or formed with a profile or recess to accommodate the divider member footers. The attachment operation(s) can include the use of fasteners such as a rivet, a screw or an adhesive, or can employ assembly techniques such as spot-welding or swaging. Once the lower base plate is attached to the upper base plate of the electronic equipment rack drawer, the process 600 may end at block 616.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method of attaching a divider to an electronic equipment rack drawer, the method comprising:
    aligning a first footer of a first divider member and a second footer of a second divider member with a corresponding opening in an upper base plate of an electronic equipment rack drawer to position the first divider member and the second divider member above a top surface of the upper base plate and below a bottom surface of a top plate of the equipment rack drawer, and to position the first footer and the second footer directly above the opening;
    inserting the first footer and the second footer into the opening by lowering the positioned first divider member and the positioned second divider member;
    rotating the first divider member and the second divider member to bring a center section of the first divider member into an adjacent, coplanar orientation with a center section of the second divider member, to bring the inserted first footer and the inserted second footer into adjacent, coplanar orientations with a bottom surface of the upper base plate, and to bring a first header of the first divider member and a second header of the second divider member into adjacent, coplanar orientations with the bottom surface of the top plate;
    attaching the center section of the rotated first divider member to the center section of the rotated second divider member;
    positioning a lower base plate of the electronic equipment rack below the rotated first footer and the rotated second footer to bring a top surface of the lower base plate into adjacent, coplanar orientation with the rotated first footer and the rotated second footer;
    attaching the rotated first footer and the rotated second footer to the bottom surface of the upper base plate and to the top surface of the lower base plate; and
    attaching the rotated first header and the rotated second header to the bottom surface of the top plate.

\* \* \* \* \*